US011875912B2

(12) United States Patent
Kojima (10) Patent No.: US 11,875,912 B2
(45) Date of Patent: Jan. 16, 2024

(54) SHIELDED FLAT CABLE (71) Applicant: SUMITOMO ELECTRIC INDUSTRIES, LTD., Osaka (JP)

(72) Inventor: Chiaki Kojima, Tochigi (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 230 days.

(21) Appl. No.: 17/597,789

(22) PCT Filed: Mar. 25, 2021

(86) PCT No.: PCT/JP2021/012645
§ 371 (c)(1),
(2) Date: Jan. 24, 2022

(87) PCT Pub. No.: WO2022/004074
PCT Pub. Date: Jan. 6, 2022

(65) Prior Publication Data
US 2022/0270783 A1 Aug. 25, 2022

(30) Foreign Application Priority Data
Jul. 2, 2020 (JP) ................................ 2020-114586

(51) Int. Cl.
*H05K 9/00* (2006.01)
*H01B 7/08* (2006.01)
(52) U.S. Cl.
CPC ......... *H01B 7/0823* (2013.01); *H05K 9/0098* (2013.01)

(58) Field of Classification Search
CPC .................................................. H05K 9/0098
See application file for complete search history.

(56) References Cited

U.S. PATENT DOCUMENTS

| 2005/0200557 A1* | 9/2005 | Tanaka | H01P 3/003 |
| | | | 343/904 |
| 2008/0185167 A1* | 8/2008 | Lee | H01B 7/0823 |
| | | | 174/117 F |

(Continued)

FOREIGN PATENT DOCUMENTS

| JP | H03-084514 U | 8/1991 |
| JP | 2019-207835 | 12/2019 |

(Continued)

OTHER PUBLICATIONS

International Search Report for PCT/JP2021/012645 dated Jun. 8, 2021.

*Primary Examiner* — Hung V Ngo
(74) *Attorney, Agent, or Firm* — IPUSA, PLLC (57) ABSTRACT

A shielded flat cable includes a plurality of ground lines disposed in a first plane, a pair of signal lines provided between the plurality of ground lines and disposed in the first plan, an insulating layer covering the plurality of ground lines and the pair of signal lines, and a shield layer covering the insulating layer. In a cross section perpendicular to a longitudinal direction, the plurality of ground lines include an adjacent ground line adjacent to one signal line of the pair of signal lines. A minimum distance between the pair of signal lines is smaller than a minimum distance between the adjacent ground line and the one signal line.

10 Claims, 5 Drawing Sheets

(56) References Cited

U.S. PATENT DOCUMENTS

| | | | | |
|---|---|---|---|---|
| 2011/0174515 | A1* | 7/2011 | Siahaan | H01B 7/0823 |
| | | | | 174/102 R |
| 2015/0213924 | A1* | 7/2015 | Chang | H05K 1/0218 |
| | | | | 174/107 |
| 2019/0371494 | A1 | 12/2019 | Kojima et al. | |
| 2020/0098816 | A1* | 3/2020 | Matsumoto | H01L 27/14634 |
| 2021/0065929 | A1* | 3/2021 | Kojima | H01B 7/0838 |
| 2021/0166836 | A1* | 6/2021 | Nagano | H01B 11/1091 |
| 2022/0384998 | A1* | 12/2022 | Matsuda | H01B 7/0208 |

FOREIGN PATENT DOCUMENTS

| | | |
|---|---|---|
| WO | 2019/208247 | 10/2019 |
| WO | 2019/208737 | 10/2019 |

\* cited by examiner

FIG.2

SHIELDED FLAT CABLE

TECHNICAL FIELD

The present disclosure relates to a shielded flat cable.

This application is based upon and claims priority to Japanese Patent Application No. 2020-114586, filed on Jul. 2, 2020, the entire contents of which are incorporated herein by reference.

BACKGROUND ART

A shielded flat cable is known as a cable used for high-speed transmission of a differential signal. In the shielded flat cable, for example, two signal lines through which the differential signal is transmitted may be disposed between two ground lines (for example, Patent Document 1).

PRIOR ART DOCUMENT

Patent Document

[Patent Document 1] Japanese Laid-Open Patent Publication No. 2019-207835

SUMMARY OF INVENTION

A shielded flat cable includes a plurality of ground lines disposed in a first plane, a pair of signal lines provided between the plurality of ground lines and disposed in the first plane, an insulating layer that covers the plurality of ground lines and the pair of signal lines, and a shield layer that covers the insulating layer. In a cross section perpendicular to a longitudinal direction, the plurality of ground lines include an adjacent ground line adjacent to one signal line of the pair of signal lines. A minimum distance between the pair of signal lines is smaller than a minimum distance between the adjacent ground line and the one signal line.

DESCRIPTION OF EMBODIMENTS

Problems to be Solved by Present Disclosure

Although the shielded flat cable described in PTL 1 can achieve some intended purpose, crosstalk may occur as a frequency of a signal further increases.

An object of the present disclosure is to provide a shielded flat cable in which crosstalk can be further reduced.

Advantageous Effects of Present Disclosure

According to the present disclosure, crosstalk can be further reduced.

In the following, embodiments will be described.

DESCRIPTION OF EMBODIMENTS OF PRESENT DISCLOSURE

First, embodiments of the present disclosure will be listed and described.

<1> A shielded flat cable according to one embodiment of the present disclosure includes a plurality of ground lines disposed in a first plane, a pair of signal lines provided between the plurality of ground lines and disposed in the first plane, an insulating layer that covers the plurality of ground lines and the pair of signal lines, and a shield layer that covers the insulating layer. In a cross section perpendicular to a longitudinal direction, the plurality of ground lines includes an adjacent ground line adjacent to one signal line of the pair of signal lines. In the cross section perpendicular to the longitudinal direction, a minimum distance between the pair of signal lines is smaller than a minimum distance between the adjacent ground line and the one signal line.

In the cross section perpendicular to the longitudinal direction, the minimum distance between the pair of signal lines is smaller than the minimum distance between the adjacent ground line adjacent to one signal line of the pair of signal lines and the one signal line. Therefore, the capacitance between the adjacent ground line and the one signal line can be reduced, and crosstalk caused by capacitive noise can be reduced.

<2> According to <1>, in the cross section, a maximum dimension of the adjacent ground line in a direction parallel to the first plane may be smaller than a maximum dimension of the one signal line in the direction parallel to the first plane. In this case, crosstalk can be more easily reduced.

<3> According to <1> or <2>, in the cross section, a center-to-center distance between the pair of signal lines may be smaller than a center-to-center distance of the adjacent ground line and the one signal line. In this case, crosstalk can be more easily reduced.

<4> According to <1> to <3>, in the cross section, a cross-sectional area of the adjacent ground line may be smaller than a cross-sectional area of the one signal line. In this case, crosstalk can be more easily reduced.

<5> A shielded flat cable according to another one aspect of the present disclosure includes a first ground line, a second ground line, and a third ground line disposed in a first plane. The shielded flat cable also includes a pair of a first signal line and a second signal line provided between the first ground line and the second ground line and disposed in the first plane. The shielded flat cable also includes a pair of a third signal line and a fourth signal line provided between the second ground line and the third ground line and disposed in the first plane. The shielded flat cable also includes an insulating layer that covers the first ground line, the second ground line, the third ground line, the first signal line, the second signal line, the third signal line, and the fourth signal line. The shielded flat cable also includes a shield layer that covers the insulating layer. The second signal line is disposed closer to the second ground line than the first signal line is. The fourth signal line is closer to the third ground line than the third signal line is. In a cross section perpendicular to a longitudinal direction, a minimum distance between the first signal line and the second signal line is smaller than a minimum distance between the first ground line and the first signal line and a minimum distance between the second ground line and the second signal line. In the cross section perpendicular to the longitudinal direction, a minimum distance between the third signal line and the fourth signal line is smaller than a minimum distance between the second ground line and the third signal line and a minimum distance between the third ground line and the fourth signal line. In the cross section perpendicular to the longitudinal direction, a maximum dimension of each of the first ground line, the second ground line, and the third ground line in a direction parallel to the first plane is smaller than a maximum dimension of each of the first signal line, the second signal line, the third signal line, and the fourth signal line in the direction parallel to the first plane. In the cross section perpendicular to the longitudinal direction, a center-to-center distance of the first signal line and the second signal line is smaller than a center-to-center distance of the first ground line and the first signal line and a center-to-center distance of the second ground line and the second signal line. In the cross section perpendicular to the longitudinal direction, a center-to-center distance of the third signal line and the fourth signal line is smaller than a center-to-center distance of the second ground line and the third signal line and a center-to-center distance of the third ground line and the fourth signal line.

The capacitance between the first ground line and the first signal line, the capacitance between the second ground line and the second signal line, and the capacitance between the second ground line and the third signal line, and the capacitance between the third ground line and the fourth signal line can be reduced and crosstalk caused by capacitive noise can be reduced.

DETAILS OF EMBODIMENTS OF PRESENT DISCLOSURE

In the following, an embodiment of the present disclosure will be described in detail. However, the present disclosure is not limited to the following embodiment. It should be noted that the specification and the drawings of the present application, the same reference numerals may be assigned to components having substantially the same function/configuration so that repetitive descriptions may be omitted. In each drawing, a XYZ orthogonal coordinate system is set for convenience of description.

First Embodiment

Figure 1:
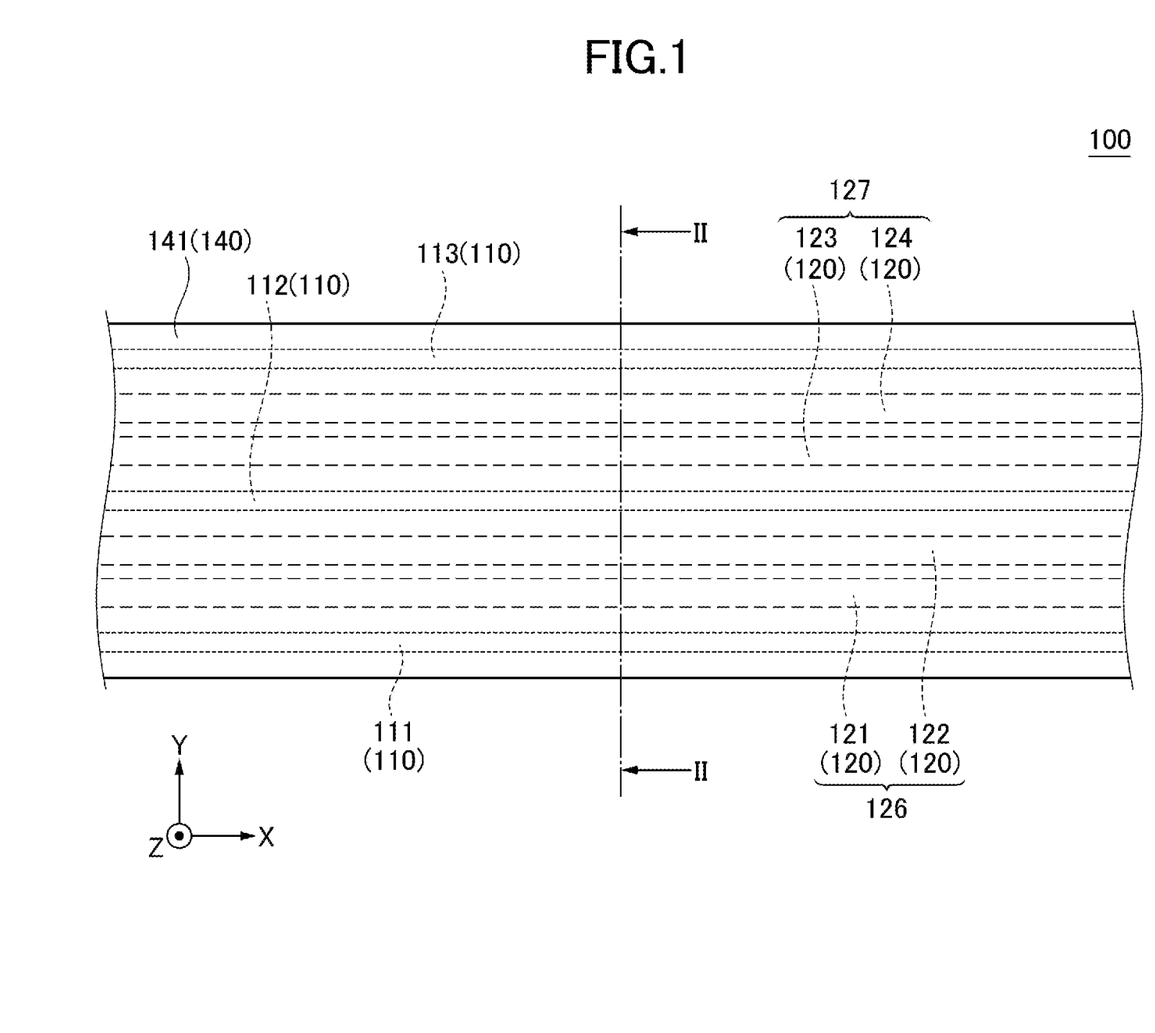
FIG. 1 is a plan view illustrating a shielded flat cable according to a first embodiment.
Figure 2:
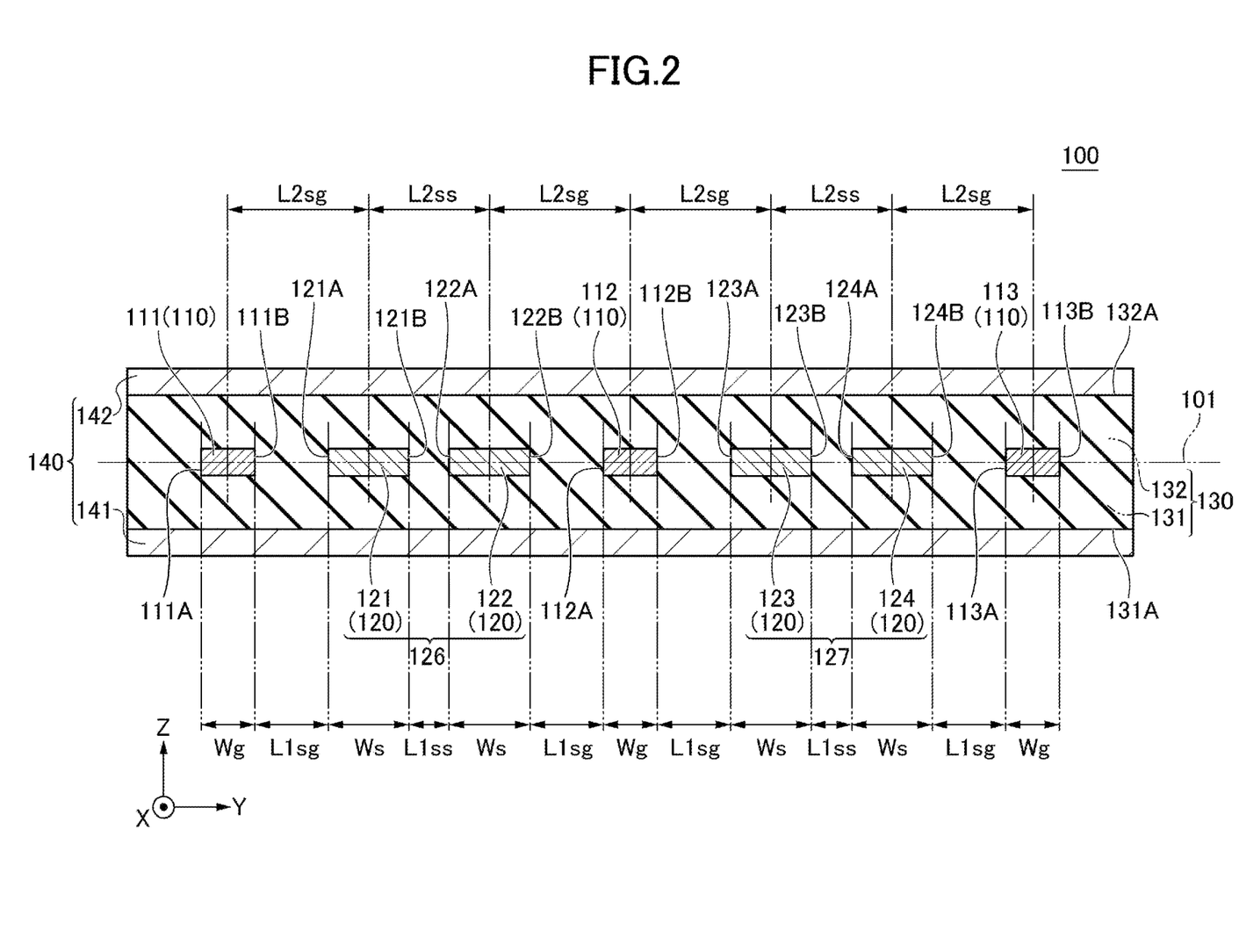
FIG. 2 is a cross sectional view illustrating a shielded flat cable according to the first embodiment.

The first embodiment will be described. FIG. 1 is a plan view illustrating the shielded flat cable according to the first embodiment. FIG. 2 is a cross sectional view illustrating the shielded flat cable according to the first embodiment. FIG. 2 is a cross sectional view along line II-II in FIG. 1.

As shown in FIGS. 1 and 2, a shielded flat cable 100 according to the first embodiment includes a plurality of ground lines 110 disposed along a first plane 101 parallel to an XY-plane. Shielded flat cable 100 further includes a plurality of signal lines 120 disposed along ground lines 110, provided between ground lines 110, and disposed in first plane 101. Ground line 110 and signal line 120 extend, for example, in an X-axis direction. Shielded flat cable 100 includes, for example, three ground lines 110 and four signal lines 120. Ground line 110 and signal line 120 are made of metal such as copper foil or tin-plated annealed copper foil.

Three ground lines 110 include a first ground line 111, a second ground line 112, and a third ground line 113. Second ground line 112 is disposed at a +Y side of first ground line 111, and third ground line 113 is disposed at a +Y side of second ground line 112. That is, in a Y-axis direction, second ground line 112 is disposed between first ground line 111 and third ground line 113.

Four signal lines 120 include a first signal line 121, a second signal line 122, a third signal line 123, and a fourth signal line 124. First signal line 121 and second signal line 122 are disposed between first ground line 111 and second ground line 112 in the Y-axis direction. Second signal line 122 is disposed at a +Y side of first signal line 121. Therefore, first signal line 121 and first ground line 111 are adjacent to each other, and second signal line 122 and second ground line 112 are adjacent to each other. Third signal line 123 and fourth signal line 124 are disposed between second ground line 112 and third ground line 113 in the Y-axis direction. Fourth signal line 124 is disposed at a +Y side of third signal line 123. Therefore, third signal line 123 and second ground line 112 are adjacent to each other, and fourth signal line 124 and third ground line 113 are adjacent to each other. A first signal line pair 126 of first signal line 121 and second signal line 122 is used for transmission of a first differential signal, and a second signal line pair 127 of third signal line 123 and fourth signal line 124 is used for transmission of a second differential signal.

Shielded flat cable 100 includes an insulating layer 130 that sandwiches first plane 101 and covers ground lines 110 and signal lines 120. For example, insulating layer 130 includes a first insulating layer 131 disposed at a −Z side of first plane 101 and a second insulating layer 132 disposed at a +Z side of first plane 101. First insulating layer 131 includes a second plane 131A opposite to first plane 101. Second insulating layer 132 includes a second plane 132A opposite to first plane 101. Second plane 131A and 132A are examples of outer surfaces.

Shielded flat cable 100 includes a shield layer 140 that covers insulating layer 130. Shield layer 140 includes a first shield layer 141 covering second plane 131A of first insulating layer 131 and a second shield layer 142 covering second plane 132A of second insulating layer 132. If one of first shield layer 141 and second shield layer 142 is provided, the other may not be provided in order to improve flexibility of shielded flat cable 100. First shield layer 141 and second shield layer 142 may further cover a side surface parallel to a ZX plane of insulating layer 130.

For example, ground line 110 and signal line 120 are flat conductors, and shapes of ground line 110 and signal line 120 in a cross section perpendicular to a longitudinal direction of shielded flat cable 100 (the cross section shown in FIG. 2) are rectangles. In the cross section shown in FIG. 2, for example, thicknesses (dimensions in a Z-axis direction) of ground line 110 and signal line 120 are greater than or equal to 0.01 mm and less than or equal to 0.10 mm.

First ground line 111 includes a side surface 111A on the −Y side and a side surface 111B on the +Y side. Second ground line 112 includes a side surface 112A on the −Y side and a side surface 112B on the +Y side. Third ground line 113 includes a side surface 113A on the −Y side and a side surface 113B on the +Y side. First signal line 121 includes a side surface 121A on the −Y side and a side surface 121B on the +Y side. Second signal line 122 includes a side surface 122A on the −Y side and a side surface 122B on the +Y side. Third signal line 123 includes a side surface 123A on the −Y side and a side surface 123B on the +Y side. Fourth signal line 124 includes a side surface 124A on the −Y side and a side surface 124B on the +Y side.

In the cross section illustrated in FIG. 2, a width of first ground line 111, a width of second ground line 112, and a width of third ground line 113 are equal to each other. These widths are expressed as width Wg. The width of first ground line 111 is a distance between side surface 111A and side surface 111B, the width of second ground line 112 is the distance between side surface 112A and side surface 112B, and the width of third ground line 113 is the distance between side surface 113A and side surface 113B. In the cross section illustrated in FIG. 2, a width of first signal line 121, a width of second signal line 122, a width of third signal line 123, and a width of fourth signal line 124 are equal to each other. These widths are expressed as width Ws. The width of first signal line 121 is a distance between side surface 121A and side surface 121B, the width of second signal line 122 is a distance between side surface 122A and side surface 122B, the width of third signal line 123 is a distance between side surface 123A and side surface 123B, and the width of fourth signal line 124 is a distance between side surface 124A and side surface 124B. For example, width Wg of ground line 110 is greater than or equal to 0.10 mm and less than or equal to 0.20 mm, and width Ws of signal line 120 is greater than or equal to 0.20 mm and less than or equal to 0.30 mm. Width Wg is smaller than width Ws. That is, in the cross section illustrated in FIG. 2, the maximum dimension of ground line 110 in the direction (Y-axis direction) along first plane 101 is smaller than the maximum dimension of signal line 120 in the direction (Y-axis direction) along first plane 101. Further, in the cross section illustrated in FIG. 2, the cross-sectional area of ground line 110 is smaller than the cross-sectional area of signal line 120.

In the cross section illustrated in FIG. 2, a distance between side surface 121B of first signal line 121 and side surface 122A of second signal line 122 is equal to a distance between side surface 123B of third signal line 123 and side surface 124A of fourth signal line 124. These distances are expressed as distance L1$ss$. In the cross section illustrated in FIG. 2, a distance between side surface 111B of first ground line 111 and side surface 121A of first signal line 121, a distance between side surface 112A of second ground line 112 and side surface 122B of second signal line 122, a distance between side surface 112B of second ground line 112 and side surface 123A of third signal line 123, and a distance between side surface 113A of third ground line 113 and side surface 124B of fourth signal line 124 are equal to each other. These distances are expressed as distance L1$sg$. For example, distance L1$ss$ is greater than or equal to 0.25 mm and less than or equal to 0.45 mm, distance L1$sg$ is greater than or equal to 0.35 mm and less than or equal to 0.55 mm. Distance L1$ss$ is smaller than distance L1$sg$. That is, in the cross section illustrated in FIG. 2, the minimum distance (distance in the Y-axis direction) between two adjacent signal lines 120 is smaller than the minimum distance (distance in the Y-axis direction) between ground line 110 and signal line 120 adjacent to each other.

In the cross section illustrated in FIG. 2, a distance of a center of first signal line 121 and a center of second signal line 122 and a distance of a center of third signal line 123 and a center of fourth signal line 124 are equal to each other. These distances are expressed as distance L2$ss$. In the cross section illustrated in FIG. 2, a distance of a center of first ground line 111 and the center of first signal line 121, a distance of a center of second ground line 112 and the center of second signal line 122, a distance of the center of second ground line 112 and the center of third signal line 123, and a distance of a center of third ground line 113 and the center of fourth signal line 124 are equal to each other. These distances are expressed as distance L2$sg$. For example, distance L2$ss$ is greater than or equal to 0.55 mm and less than or equal to 0.65 mm, distance L2$sg$ is greater than or equal to 0.60 mm and less than or equal to 0.70 mm. Distance L2$ss$ is smaller than distance L2$sg$. That is, in the cross section illustrated in FIG. 2, the center-to-center distance (distance in the Y-axis direction) of two adjacent signal lines 120 is smaller than the center-to-center distance (distance in the Y-axis direction) of ground line 110 and signal line 120 adjacent to each other.

Because ground line 110 and signal line 120 are covered with insulating layer 130, the above-described arrangement state of ground line 110 and signal line 120 is maintained.

Examples of a material of insulating layer 130 include polyester resins, polyphenylene sulfide resins, and polyimide resins. Polyester resins include polyethylene terephthalate resins, polyethylene naphthalate resins, polybutylene naphthalate resins, or the like. Among these resins, polyethylene terephthalate resins are preferable from the viewpoints of electrical characteristics, mechanical characteristics, cost, or the like. A thickness of first insulating layer 131 and second insulating layer 132 is, for example, greater than or equal to 9 μm and less than or equal to 100 μm.

Each of first shield layer 141 and second shield layer 142 includes an adhesive layer, a resin layer, and a metal layer provided in order from insulating layer 130 side. As the metal layer, for example, an aluminum foil is used. Examples of a material of the resin layer include polyethylene terephthalate and low dielectric constant polyethylene. When the resin layer has adhesiveness, the adhesive layer may not be included. A thicknesses of first shield layer 141 and second shield layer 142 are, for example, greater than or equal to 30 μm and less than or equal to 90 μm.

In shielded flat cable 100 according to the first embodiment, distance L1$ss$ is smaller than distance L1$sg$. For this reason, it is possible to reduce the capacitance between ground line 110 and signal line 120 adjacent to each other and to reduce crosstalk caused by capacitive noise. For example, crosstalk between the first differential signal transmitted by using first signal line pair 126 and the second differential signal transmitted by using second signal line pair 127 can be reduced.

Second Embodiment

Figure 3:
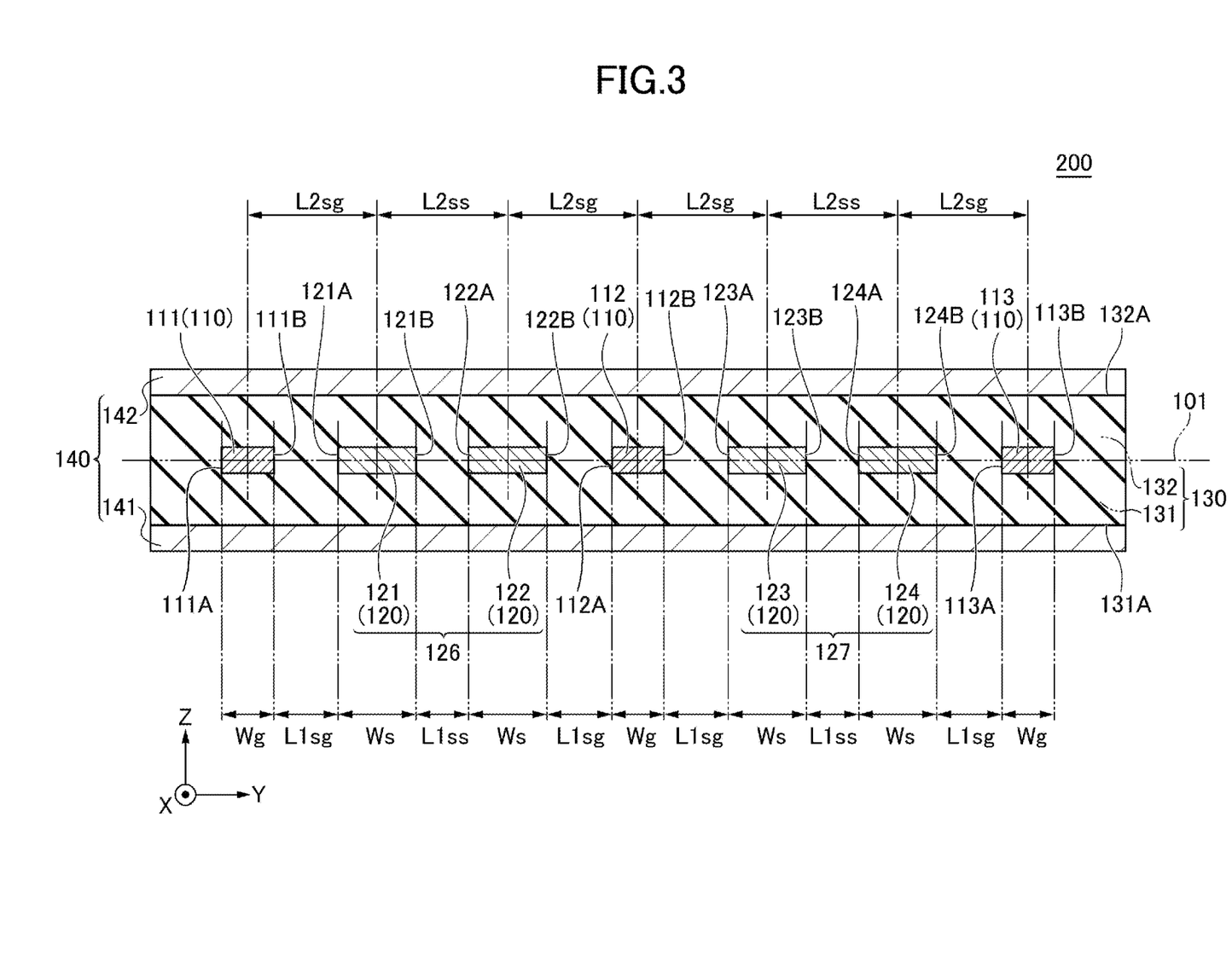
FIG. 3 is a cross sectional view illustrating a shielded flat cable according to a second embodiment.

The second embodiment will be described. FIG. 3 is a cross sectional view illustrating the shielded flat cable according to the second embodiment. The second embodiment is different from the first embodiment mainly in the arrangement of signal line 120.

As illustrated in FIG. 3, in a shielded flat cable 200 according to the second embodiment, distance L2$ss$ and distance L2$sg$ are equal to each other. Meanwhile, similar to the first embodiment, distance L1$ss$ is smaller than distance L1$sg$, width Wg is smaller than width Ws, and the cross-sectional area of ground line 110 is smaller than the cross-sectional area of signal line 120. For example, width Wg of ground line 110 is greater than or equal to 0.10 mm and less than or equal to 0.20 mm, and width Ws of signal line 120 is greater than or equal to 0.20 mm and less than or equal to 0.30 mm. For example, distance L1$ss$ is not less than 0.25 mm and not more than 0.50 mm, and distance L1$sg$ is greater than or equal to 0.30 mm and less than or equal to 0.55 mm. For example, distance L2$ss$ and distance L2$sg$ are greater than or equal to 0.55 mm and less than or equal to 0.70 mm.

Other configurations are the same as those of the first embodiment.

Also in shielded flat cable 200 according to the second embodiment, distance L1$ss$ is smaller than distance L1$sg$. For this reason, it is possible to reduce the capacitance between ground line 110 and signal line 120 adjacent to each other and to reduce crosstalk caused by capacitive noise. For example, crosstalk between the first differential signal transmitted by using first signal line pair 126 and the second differential signal transmitted by using second signal line pair 127 can be reduced.

Third Embodiment

Figure 4:
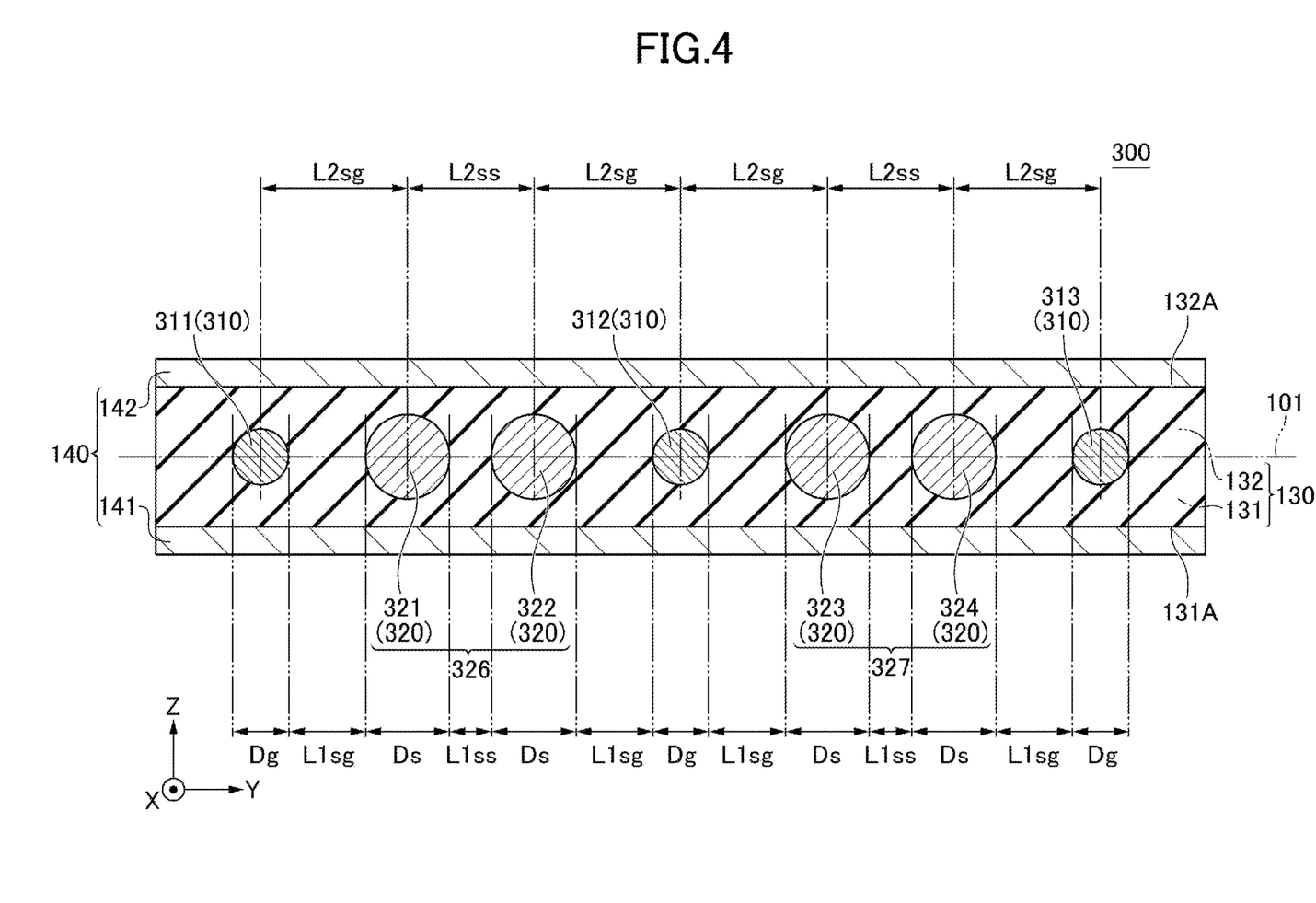
FIG. 4 is a cross sectional view illustrating a shielded flat cable according to a third embodiment.

The third embodiment will be described. FIG. 4 is a cross sectional view illustrating the shielded flat cable according to the third embodiment. The third embodiment is different from the first embodiment mainly in a cross-sectional shape of the ground line and the signal line.

As illustrated in FIG. 4, a shielded flat cable 300 according to the third embodiment includes three ground lines 310 and four signal lines 320 instead of three ground lines 110 and four signal lines 120.

Three ground lines 310 include a first ground line 311, a second ground line 312, and a third ground line 313. Second ground line 312 is disposed on a +Y side of first ground line 311, and third ground line 313 is disposed on a +Y side of second ground line 312. That is, in the Y-axis direction, second ground line 312 is disposed between first ground line 311 and third ground line 313.

Four signal lines 320 include a first signal line 321, a second signal line 322, a third signal line 323, and a fourth signal line 324. First signal line 321 and second signal line 322 are disposed between first ground line 311 and second ground line 312 in the Y-axis direction. Second signal line 322 is disposed at a +Y side of first signal line 321. Therefore, first signal line 321 and first ground line 311 are adjacent to each other, and second signal line 322 and second ground line 312 are adjacent to each other. Third signal line 323 and fourth signal line 324 are disposed between second ground line 312 and third ground line 313 in the Y-axis direction. Fourth signal line 324 is disposed at a +Y side of third signal line 323. Therefore, third signal line 323 and second ground line 312 are adjacent to each other, and fourth signal line 324 and third ground line 313 are adjacent to each other. A first signal line pair 326 of first signal line 321 and second signal line 322 is used for transmission of the first differential signal, and a second signal line pair 327 of third signal line 323 and fourth signal line 324 is used for transmission of the second differential signal.

For example, ground line 310 and signal line 320 are round conductors, and the shapes of ground line 310 and signal line 320 in a cross section perpendicular to the longitudinal direction of shielded flat cable 300 (the cross section shown in FIG. 4) are circles. In the cross section illustrated in FIG. 4, for example, diameter Dg of ground line 310 is greater than or equal to 0.10 mm and less than or equal to 0.20 mm, and diameter Ds of signal line 320 is greater than or equal to 0.20 mm and less than or equal to 0.30 mm. That is, in the cross section illustrated in FIG. 4, the maximum dimension of ground line 310 in the direction (Y-axis direction) along first plane 101 is smaller than the maximum dimension of signal line 320 in the direction (Y-axis direction) along first plane 101. Further, in the cross section illustrated in FIG. 4, the cross-sectional area of ground line 310 is smaller than the cross-sectional area of signal line 320.

In the cross section illustrated in FIG. 4, the minimum distance between first signal line 321 and second signal line 322 and the minimum distance between third signal line 323 and fourth signal line 324 are equal to each other. These distances are expressed as distance L1$ss$. In the cross section illustrated in FIG. 4, the minimum distance between first ground line 311 and first signal line 321, the minimum distance between second ground line 312 and second signal line 322, the minimum distance between second ground line 312 and third signal line 323, and the minimum distance between third ground line 313 and fourth signal line 324 are equal to each other. These distances are expressed as distance L1$sg$. For example, distance L1$ss$ is greater than or equal to 0.25 mm and less than or equal to 0.45 mm, and distance L1$sg$ is greater than or equal to 0.35 mm and less than or equal to 0.55 mm. Distance L1$ss$ is smaller than distance L1$sg$. That is, in the cross section illustrated in FIG. 4, the minimum distance (distance in the Y-axis direction) between two adjacent signal lines 320 is smaller than the minimum distance (distance in the Y-axis direction) between ground line 310 and signal line 320 adjacent to each other.

In the cross section illustrated in FIG. 4, a distance of a center of first signal line 321 and a center of second signal line 322 and a distance of a center of third signal line 323 and a center of fourth signal line 324 are equal to each other. These distances are expressed as distance L2$ss$. In the cross section illustrated in FIG. 4, a distance of a center of first ground line 311 and a center of first signal line 321, a distance of a center of second ground line 312 and a center of second signal line 322, a distance of a center of second ground line 312 and a center of third signal line 323, and a distance of a center of third ground line 313 and the center of fourth signal line 324 are equal to each other. These distances are expressed as distance L2$sg$. For example, distance L2$ss$ is greater than or equal to 0.55 mm and less than or equal to 0.65 mm, distance L2$sg$ is greater than or equal to 0.60 mm and less than or equal to 0.70 mm. Distance L2$ss$ is smaller than distance L2$sg$. That is, in the cross section illustrated in FIG. 4, the center-to-center distance (distance in the Y-axis direction) of two adjacent signal lines 320 is smaller than the center-to-center distance (distance in the Y-axis direction) of ground line 310 and signal line 320 adjacent to each other.

Other configurations are the same as those of the first embodiment.

Also in shielded flat cable 300 according to the third embodiment, distance L1$ss$ is smaller than distance L1$sg$. For this reason, it is possible to reduce the capacitance between ground line 310 and signal line 320 adjacent to each other and to reduce crosstalk caused by capacitive noise. For example, crosstalk between the first differential signal transmitted by using first signal line pair 326 and the second differential signal transmitted by using second signal line pair 327 can be reduced.

Fourth Embodiment

Figure 5:
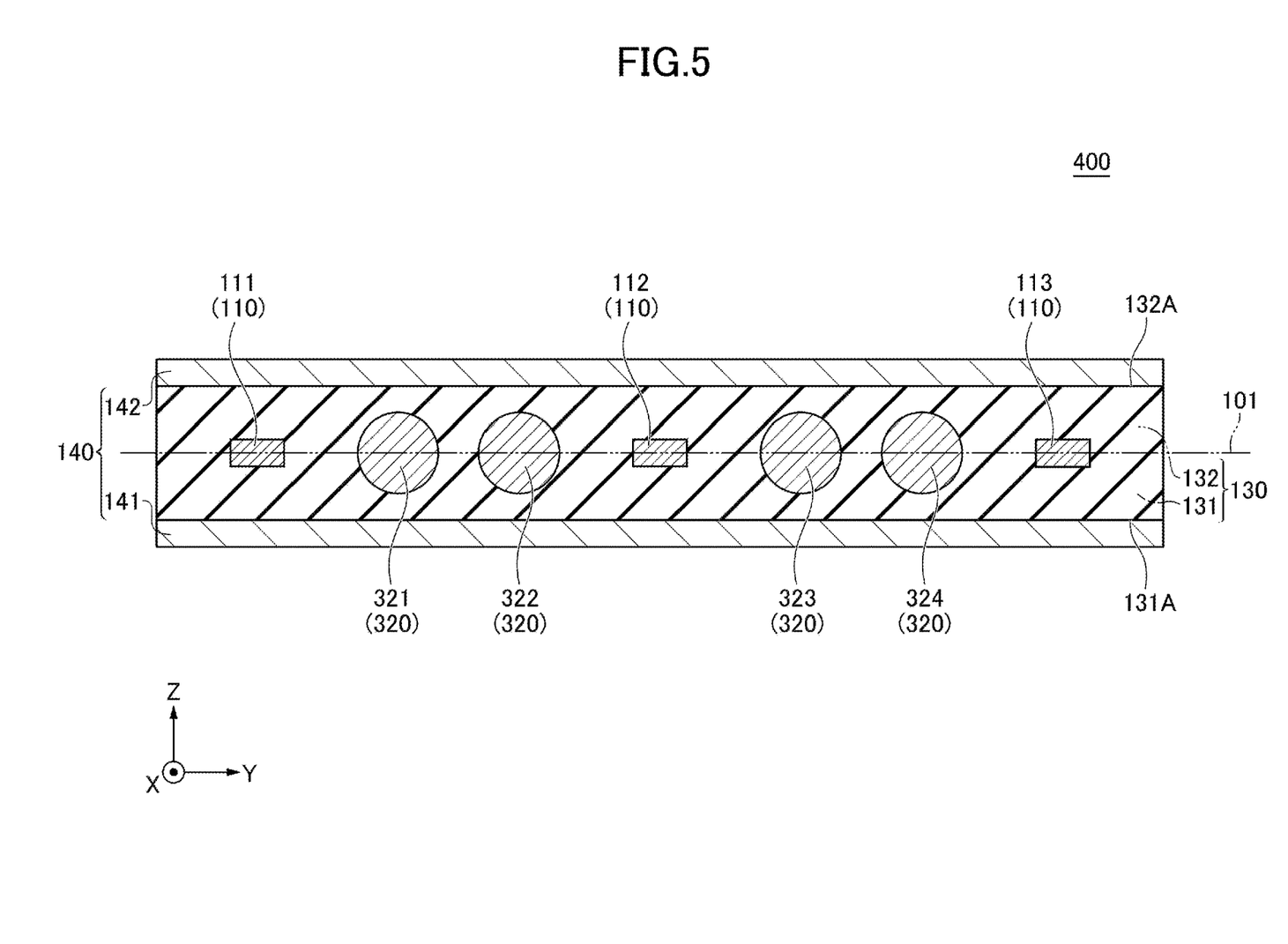
FIG. 5 is a cross sectional view illustrating a shielded flat cable according to a fourth embodiment.

The fourth embodiment will be described. FIG. 5 is a cross sectional view illustrating the shielded flat cable according to the fourth embodiment. The fourth embodiment is different from the first embodiment mainly in a cross-sectional shape of the signal line.

As illustrated in FIG. 5, a shielded flat cable 400 according to the fourth embodiment includes four signal lines 320 similar to those of shielded flat cable 300 according to the third embodiment instead of four signal lines 120. Four signal lines 320 include first signal line 321, second signal line 322, third signal line 323, and fourth signal line 324. The arrangement of first signal line 321, second signal line 322, third signal line 323, and fourth signal line 324 is the same as the arrangement of the third embodiment.

Other configurations are the same as those of the first embodiment.

In shielded flat cable 400 according to the fourth embodiment, the same effects as those of the first and third embodiments can be achieved.

In the cross section illustrated in FIGS. 2 to 5, when the maximum dimension (width Wg, diameter Dg) of ground lines 110 and 310 in the direction along first plane 101 is smaller than the maximum dimension (width Ws, diameter Ds) of the signal lines 120 and 320 in the direction along first plane 101, it is easy to make distance L1ss smaller than distance L1sg. Therefore, crosstalk can be more easily reduced.

In the cross section illustrated in FIGS. 2 to 5, when center-to-center distance L2ss of two adjacent signal lines 120, 320 is smaller than center-to-center distance L2sg of ground line 110, 310 and signal line 120, 320 adjacent to each other, it is easy to make distance L1ss smaller than distance L1sg. Therefore, crosstalk can be more easily reduced.

In the cross sections shown in FIGS. 2 to 5, when the cross-sectional area of ground line 110, 310 is smaller than the cross-sectional area of signal line 120, 320, it is easy to make distance L1ss smaller than distance L1sg. Therefore, crosstalk can be more easily reduced.

In the present disclosure, the ground line and the signal line are not limited to flat conductors or round conductors. For example, the cross-sectional shape perpendicular to the longitudinal direction of the ground line and the signal line may be ellipses, other polygons, or the like. Note that each center of the ground line and the signal line is the center of two points farthest from each other in the ground line and the signal line in the direction along an intersection line between a cross section perpendicular to the longitudinal direction of the shielded flat cable and the first plane (the Y-axis direction in FIGS. 2 to 5).

Distance L2ss and Distance L2sg in the third and fourth embodiments may be equal to each other like the second embodiment.

The number of ground lines and signal lines included in the shielded flat cable is not limited. For example, two ground lines may be disposed between two signal line pairs.

The embodiments have been described in detail, but the present invention is not limited to the specific embodiments, and various variations and modifications may be made within the scope of the present invention.

REFERENCE SIGNS LIST

100: shielded flat cable
101: first plane
110: ground line
111: first ground line
111A, 111B: side surface
112: second ground line
112A, 112B: side surface
113: third ground line
113A, 113B: side surface
120: signal line
121: first signal line
121A, 121B: side surface
122: second signal line
122A, 122B: side surface
123: third signal line
123A, 123B: side surface
124: fourth signal line
124A, 124B: side surface
126: first signal line pair
127: second signal line pair
130: insulating layer
131: first insulating layer
131A: second plane
132: second insulating layer
132A: second plane
140: shield layer
141: first shield layer
142: second shield layer
200: shielded flat cable
300: shielded flat cable
310: ground line
311: first ground line
312: second ground line
313: third ground line
320: signal line
321: first signal line
322: second signal line
323: third signal line
324: fourth signal line
326: first signal line pair
327: second signal line pair
400: shielded flat cable
Dg, Ds: diameter
L1sg, L1ss, L2sg, L2ss: distance
Wg, Ws: width

The invention claimed is:

1. A shielded flat cable comprising:
a plurality of ground lines disposed in a first plane;
a pair of signal lines provided between the plurality of ground lines and disposed in the first plane, the pair of signal lines including a first pair of signal lines and a second pair of signal lines;
an insulating layer that covers the plurality of ground lines and the pair of signal lines; and
at least one Shield layer that covers the insulating layer,
wherein the first pair of signal lines includes a first signal line and a second signal line adjacent to the first signal line,
the second pair of signal lines includes a third signal line and a fourth signal line adjacent to the third signal line, and
the plurality of ground lines include a first ground line that is provided between the second signal line and the third signal line, and
wherein, in a cross section perpendicular to a longitudinal direction of the shielded flat cable,
a minimum distance between the first signal line and the second signal line is smaller than a minimum distance between the second signal line and the first ground line, and
a minimum distance between the third signal line and the fourth signal line is smaller than a minimum distance between the third signal line and the first ground line.

2. The shielded flat cable according to claim 1, wherein, in the cross section,
a center-to-center distance of the first signal line and the second signal line is smaller than a center-to-center distance of the second signal line and the first ground line, and
a center-to-center distance of the third signal line and the fourth signal line is smaller than a center-to-center distance of the third signal line and the first ground line.

3. The shielded flat cable according to claim 1, wherein, in the cross section, a center-to-center distance of the first signal line and the second signal line is equal to a center-to-center distance of the second signal line and the first ground line, and a center-to-center distance of the third signal line and the fourth signal line is equal to a center-to-center distance of the third signal line and the first ground line.

4. The shielded flat cable according to claim 1, wherein the insulating layer is in contact with an entire surface of each of the first signal line, the second signal line, the third signal line, the fourth signal line, and the first ground line.

5. The shielded flat cable according to claim 1, wherein, in the cross section, a maximum dimension of the first ground line in a direction parallel to the first plane is smaller than a maximum dimension of the second signal line in the direction parallel to the first plane, and the maximum dimension of the first ground line is smaller than a maximum dimension of the third signal line in the direction parallel to the first plane.

6. The shielded flat cable according to claim 1, wherein, in the cross section, a cross-sectional area of the first ground line is smaller than a cross-sectional area of the second signal line, and the cross-sectional area of the first ground line is smaller than a cross-sectional area of the third signal line.

7. The shielded flat cable according to claim 1, wherein the at least one shield layer includes a first shield layer that covers a bottom surface of the insulating layer and a second shield layer that covers a top surface of the insulating layer.

8. The shielded flat cable according to claim 1, wherein the first signal line, the second signal line, the third signal line, and the fourth signal line are flat conductors, and the first ground line is a flat conductor.

9. The shielded flat cable according to claim 1, wherein the first signal line, the second signal line, the third signal line, and the fourth signal line are round conductors, and the first ground line is a round conductor.

10. The shielded flat cable according to claim 1, wherein the first signal line, the second signal line, the third signal line, and the fourth signal line are round conductors, and the first ground line is a flat conductor.

* * * * *